(12) United States Patent
Shibib et al.

(10) Patent No.: US 11,189,702 B2
(45) Date of Patent: Nov. 30, 2021

(54) SPLIT GATE SEMICONDUCTOR WITH NON-UNIFORM TRENCH OXIDE

(71) Applicant: Siliconix Incorporated, San Jose, CA (US)

(72) Inventors: M. Ayman Shibib, San Jose, CA (US); Misbah Azam, San Jose, CA (US); Chanho Park, San Jose, CA (US); Kyle Terrill, San Jose, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 16/262,598

(22) Filed: Jan. 30, 2019

(65) Prior Publication Data

US 2020/0243656 A1 Jul. 30, 2020

(51) Int. Cl.
| | | |
|---|---|---|
| *H01L 29/423* | (2006.01) | |
| *H01L 29/10* | (2006.01) | |
| *H01L 29/40* | (2006.01) | |
| *H01L 29/78* | (2006.01) | |

(52) U.S. Cl.
CPC ...... *H01L 29/4236* (2013.01); *H01L 29/1041* (2013.01); *H01L 29/404* (2013.01); *H01L 29/407* (2013.01); *H01L 29/7827* (2013.01)

(58) Field of Classification Search
CPC . H01L 29/1041; H01L 29/404; H01L 29/407; H01L 29/7827; H01L 29/7813; H01L 29/7825; H01L 29/42352
See application file for complete search history.

(56) References Cited

U.S. PATENT DOCUMENTS

| | | |
|---|---|---|
| 2002/0060340 A1 | 5/2002 | Deboy et al. |
| 2009/0179829 A1 | 7/2009 | Nakata et al. |
| 2010/0214016 A1* | 8/2010 | Blanchard ......... H01L 29/41766 327/574 |
| 2012/0175700 A1 | 7/2012 | Hsieh |
| 2014/0015039 A1 | 1/2014 | Hossain |
| 2014/0042535 A1 | 2/2014 | Darwish et al. |

(Continued)

FOREIGN PATENT DOCUMENTS

KR 2016-0073379 6/2016

OTHER PUBLICATIONS

Kenya Kobayashi; et al., 100-V Class Two-step-oxide Field-Plate Trench MOSFET to Achieve Optimum RESURF Effect and Ultralow On-resistance, Proceedings of the 31st International Symposium on Power Semiconductor Devices & ICs, May 19-23, 2019, Shanghai, China. pp. 1-4.

*Primary Examiner* — Christine A Enad

(57) ABSTRACT

Split gate semiconductor with non-uniform trench oxide. A metal oxide semiconductor field effect transistor (MOSFET) comprises a plurality of parallel trenches. Each such trench comprises a first electrode coupled to a gate terminal of the MOSFET and a second electrode, physically and electrically isolated from the first electrode. The second electrode is beneath the first electrode in the trench. The second electrode includes at least two different widths at different depths below a primary surface of the MOSFET. The trenches may be formed in an epitaxial layer. The epitaxial layer may have a non-uniform doping profile with respect to depth below a primary surface of the MOSFET. The second electrode may be electrically coupled to a source terminal of the MOSFET.

19 Claims, 13 Drawing Sheets

(56) References Cited

U.S. PATENT DOCUMENTS

| | | | |
|---|---|---|---|
| 2014/0175536 A1* | 6/2014 | Lee | H01L 21/823468 257/328 |
| 2014/0225187 A1 | 8/2014 | Bhalla et al. | |
| 2015/0108568 A1* | 4/2015 | Terrill | H01L 29/7813 257/331 |
| 2015/0295080 A1* | 10/2015 | Lee | H01L 29/66727 257/330 |
| 2016/0093719 A1 | 3/2016 | Kobayasi et al. | |
| 2017/0250685 A1 | 8/2017 | Bina et al. | |
| 2017/0263752 A1 | 9/2017 | Kobayasi | |
| 2018/0308943 A1 | 10/2018 | Nishiguchi | |
| 2018/0315848 A1 | 11/2018 | Huang et al. | |
| 2018/0374944 A1* | 12/2018 | Anderson | H01L 29/7787 |

\* cited by examiner

SPLIT GATE SEMICONDUCTOR WITH NON-UNIFORM TRENCH OXIDE

RELATED APPLICATIONS

This application is related to commonly owned U.S. Pat. Nos. 9,673,314 and 9,978,859, both to Park et al., both entitled "Semiconductor Device with non-Uniform Trench Oxide Layer," which are hereby incorporated herein by reference in their entireties.

FIELD OF INVENTION

Embodiments of the present invention relate to the field of integrated circuit design and manufacture. More specifically, embodiments of the present invention relate to systems and methods for split gate semiconductors with non-uniform trench oxide.

BACKGROUND

Breakdown voltage provides an indication of the ability of a semiconductor device (e.g., a metal oxide semiconductor field effect transistor (MOSFET) device) to withstand breakdown under reverse voltage conditions. To realize an energy efficient power conversion system, power MOSFETs (e.g., MOSFETs designed to handle medium to high voltage levels) should have low conduction losses. Conduction losses can be lowered by reducing $R_{DS(on)}$, the on-state resistance between the drain and the source. However, reducing $R_{DS(on)}$ adversely affects breakdown voltage.

The drift region in a MOSFET is a relatively high resistivity layer grown by epitaxial (epi) technology, and is designed to achieve particular values for electrical characteristics such as breakdown voltage and on-state trench resistance. For medium voltage (e.g., 100 V) to high voltage (e.g., 600 V) devices, the major portion of the on-state resistance comes from drift region resistance. For example, for a 200 V device, an analysis shows that 88 percent of the total on-state resistance is due to drift region resistance, while only six percent is due to channel resistance, five percent is due to package resistance, and one percent is due to substrate resistance. Consequently, reducing drift region resistance can make a significant contribution to reducing the total on-state resistance.

However, while a reduction in resistivity in the drift region of the epitaxial layer can positively affect $R_{DS(on)}$, conventionally such a reduction means that breakdown voltage would be expected to be deleteriously decreased, as noted above.

Accordingly, a semiconductor device (e.g., MOSFET) that provides reduced resistivity in the drift region, and hence has a lower on-state resistance, but does not negatively impact breakdown voltage, would be advantageous.

SUMMARY OF THE INVENTION

In overview, embodiments according to the present invention pertain to semiconductor devices, such as, but not limited to, power MOSFETs, including but not limited to, split gate MOSFETs, that have non-uniform oxide layers lining the gate trenches. Such devices will have lower resistivity in the drift region and lower on-state resistance but will have the same or about the same breakdown voltage as conventional but otherwise comparable MOSFETs.

Therefore, what is needed are systems and methods for split gate semiconductors with non-uniform trench oxide.

An additional need exists for systems and methods for split gate semiconductors with non-uniform trench oxide that have a non-uniform epitaxial layer. What is further needed are systems and methods for split gate semiconductors with non-uniform trench oxide in which a doping level of an epitaxial layer corresponds to a thickness of a trench oxide. A still further need exists for systems and methods for split gate semiconductors with non-uniform trench oxide that are compatible and complementary with existing systems and methods of integrated circuit design, manufacturing and test. Embodiments of the present invention provide these advantages.

In accordance with an embodiment of the present invention, a metal oxide semiconductor field effect transistor (MOSFET) includes a primary surface and a plurality of parallel trenches. Each such trench includes a first electrode coupled to a gate terminal of the MOSFET and a second electrode, physically and electrically isolated from the first electrode. The second electrode is beneath the first electrode in the trench. The second electrode includes at least two different widths at different depths below the primary surface of the MOSFET. The trenches may be formed in an epitaxial layer. The epitaxial layer may have a non-uniform doping profile with respect to depth below a primary surface of the MOSFET. The second electrode may be electrically coupled to a source terminal of the MOSFET.

In accordance with another embodiment of the present invention, a semiconductor device includes a substrate layer and an epitaxial layer adjacent to the substrate layer. The semiconductor device also includes a first trench structure formed in the epitaxial layer and having a bottom and sidewalls. The first trench structure includes a gate electrode, a source electrode electrically isolated from the gate electrode, and an oxide layer that lines the sidewalls adjacent to the source electrode, the oxide layer having a non-uniform thickness along the sidewalls, wherein the thickness of the oxide layer at a first distance from the bottom is less than the thickness of the oxide layer at the bottom, and wherein the thickness of the oxide layer at a second distance from the bottom, greater than the first distance, is less than the thickness of the oxide layer at the first distance.

In accordance with a further embodiment of the present invention, a semiconductor device includes a substrate layer and an epitaxial layer adjacent to the substrate layer. The semiconductor device also includes a first trench structure formed in the epitaxial layer and having a bottom a first sidewall, and a second sidewall. The first trench structure further includes a first conductive material coupled to a source terminal a second conductive material electrically isolated from the first conductive material. Still further, the first trench structure further includes an oxide layer that lines the bottom and the first and second sidewalls, the oxide layer including a first portion that spans the bottom of the first trench structure from the first sidewall to the second sidewall, a second portion extending from the first portion along the first sidewall, and a third portion extending from the second portion along the first sidewall, wherein the oxide layer has a first thickness in the second portion and a second thickness in the third portion, the second thickness less than the first thickness.

In accordance with a method embodiment of the present invention, a method for fabricating a split gate semiconductor with non-uniform trench oxide includes growing an epitaxial layer on a substrate, forming a trench in an epitaxial layer, forming an oxide layer across the bottom and along the sidewalls of the trench, filling the trench to a specified level with conductive material to cover a portion of the oxide layer, removing some of the exposed portion of the oxide layer, form an oxide layer across the top of the conductive material and filling the trench with conductive material, removing excess material and forming additional device components and connections. Filling the trench to a specified level and removing some of the exposed oxide may be repeated to achieve a desired oxide layer profile.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1:
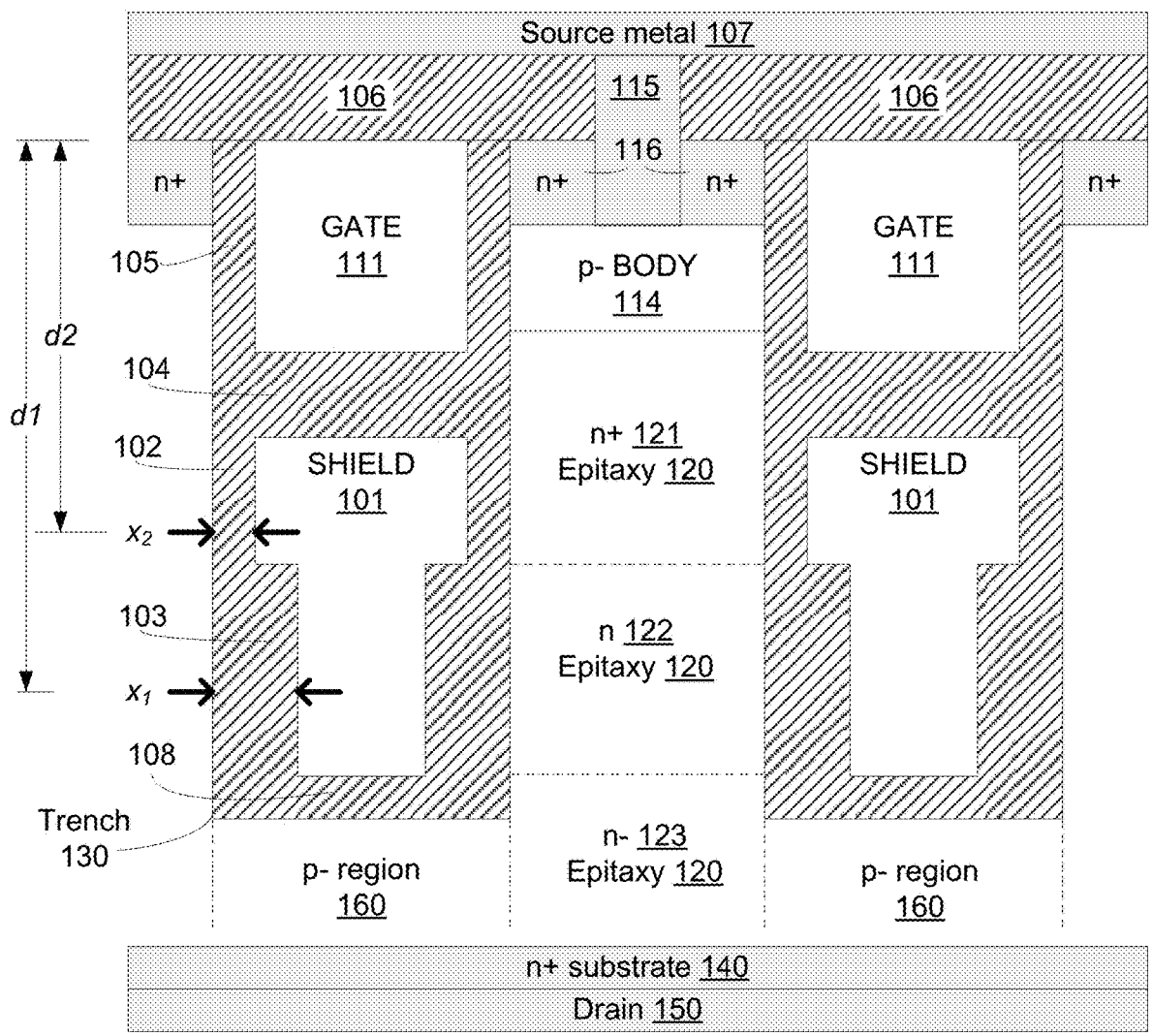
FIG. 1 illustrates an exemplary side sectional schematic view of a portion of a split gate semiconductor with non-uniform trench oxide, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, a method, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching," "adding," "removing" or the like, refer to actions and processes (e.g., semiconductor process 700 of FIG. 7) of semiconductor device fabrication.

NOTATION AND NOMENCLATURE

The figures are not drawn to scale, and only portions of the structures, as well as the various layers that form those structures, may be shown in the figures. The figures, in general, illustrate symbolic and simplified structures to convey understanding of the invention, and are not intended to reproduce physical structures in detail. Furthermore, fabrication processes and operations may be performed along with the processes and operations discussed herein; that is, there may be a number of process operations before, in between and/or after the operations shown and described herein. Importantly, embodiments in accordance with the present invention can be implemented in conjunction with these other (perhaps conventional) processes and operations without significantly perturbing them. Generally speaking, embodiments in accordance with the present invention may replace and/or supplement portions of a conventional process without significantly affecting peripheral processes and operations.

The term "MOSFET" is generally understood to be synonymous with the term insulated-gate field-effect transistor (IGFET), as many modern MOSFETs comprise a non-metal gate and/or a non-oxide gate insulator. As used herein, the term "MOSFET" does not necessarily imply or require FETs that include metal gates and/or oxide gate insulators. Rather, the term "MOSFET" includes devices commonly known as or referred to as MOSFETs.

As used herein, the letter "n" refers to an n-type dopant and the letter "p" refers to a p-type dopant. A plus sign "+" or a minus sign "−" is used to represent, respectively, a relatively higher or relatively lower concentration of such dopant(s). However, such use does not limit the absolute doping range or other aspects of these regions. For example, a doping area described as n+ or n− may also be described as an n-type doping region alternatively.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Some of the figures are discussed in the context of an n-channel device, more specifically an n-channel vertical MOSFET; however, embodiments according to the present invention are not so limited. That is, the features described herein may be utilized in a p-channel device. The discussion of an n-channel device can be readily mapped to a p-channel device by substituting p-type dopant and materials for corresponding n-type dopant and materials, and vice versa.

The term "trench" has acquired two different, but related meanings within the semiconductor arts. Generally, when referring to a process, e.g., etching, the term trench is used to mean or refer to a void of material, e.g., a hole or ditch, formed in, for example, an epitaxial ("epi") layer. Generally, the length of such a hole is much greater than its width or depth. However, when referring to a semiconductor structure or device, the term trench is used to mean or refer to a solid vertically-aligned structure, disposed beneath a primary surface of a substrate, having a complex composition, different from that of the substrate. A trench structure is frequently adjacent to a channel of a vertical trench field effect transistor (FET). The structure may comprise, for example, a gate of an FET. The term "trench structure" may be used herein at times to distinguish a filled or partially filled trench from an empty or unfilled trench. At other times, the manner in which these terms are being used will be evident from the context of the surrounding discussion.

It is to be appreciated that although the semiconductor structure commonly referred to as a "trench structure" may be formed by etching a trench and then filling the trench, the use of the structural term herein in regards to embodiments of the present invention does not imply, and is not limited to such processes.

The term "substantially" in the description and claims of the present application is used to refer to design intent, rather than a physical result. The semiconductor arts have deployed an ability to measure numerous aspects of a semiconductor to a high degree of accuracy. Accordingly, when measured to available precision, in general, no physical aspect of a semiconductor is precisely as designed. Further, measurement technology may readily identify differences in structures that are intended to be identical. Accordingly, terms such as "substantially equal" should be interpreted as designed to be equal, subject to manufacturing variation and measurement precision.

The "width" of a trench, or structure within a trench, is understood to refer to a horizontal dimension that is perpendicular to the long extent of such a trench.

It is generally desirable to place gate trenches of a trench semiconductor as close as possible. In this manner, a higher level of charge balance is achieved and the channel resistance per unit area is increased. Both characteristics contribute to beneficially reduce the on-resistance of the MOSFET. However, a conventional trench FET with Deep Dual Trench, for example, as taught by U.S. Pat. No. 9,673,314, incorporated herein by reference, inherently limits the minimum distance or cell pitch between gate trenches and the Dual Deep Trenches due to the required presence of the body regions near the surface of the semiconductor between the gate trenches and the Dual Deep Trenches.

A charge balanced split gate vertical trench metal oxide semiconductor field effect transistor (MOSFET) generally comprises trenches that extend into one or more epitaxial layers that are grown on top of a heavily doped substrate. The trenches are etched deep enough, typically a few micrometers, to be able to contain several layers of oxide and polysilicon. The trench structure comprises a lower electrode, e.g., a layer of polysilicon ("poly 1"), which is closest to the trench bottom, which is usually tied to a constant DC voltage, for example, the source electrical potential. Such an electrode is an essential part of establishing the charge balance condition that results in a desirable low "on" resistance for a given breakdown voltage. An upper electrode, e.g., an upper layer of the polysilicon ("poly 2"), within the trench structure is usually used as the gate of the device. Both electrodes are well inside the trench and separated from the epitaxial regions by different thicknesses of dielectric layers, for example, silicon dioxide. Both electrodes are physically and electrically isolated from one another, e.g., by an inter-electrode dielectric, commonly known as or referred to as an inter-poly oxide, for example insulating material 104 in FIG. 1.

In general, a lower "on" resistance, known as or referred to as the drain-source resistance, $R_{DS(on)}$, is desirable for power FETs. One way to achieve a lower $R_{DS(on)}$ is to increase the conductance of the drift region by increasing the doping concentration, e.g., of an epitaxial layer, of the drift region. However, the charge balance that allows a higher concentration of the epitaxial layer with a high breakdown voltage is limited by the thickness of the oxide layer separating the epitaxial layer from the field electrode.

To further reduce the on resistance $R_{DS(on)}$, a dopant concentration of the epitaxial layer may be increased. For a uniform oxide thickness in a trench next to a shield electrode, such an increased dopant level would deleteriously reduce the breakdown voltage to an undesirable lower value. To overcome this limitation, in accordance with embodiments of the present invention, the thickness of the oxide in the trench may be adjusted, for example, made non-uniform, so that the epitaxial layer dopant concentration is matched to the appropriate oxide thickness. Thus, if the dopant concentration of the epitaxial layer is increased, a thinner oxide may be used where the concentration is high, and a thicker oxide may be utilized in regions where the doping concentration of the epitaxial layer is lower.

FIG. 1 illustrates an exemplary side sectional schematic view of a portion of a split gate semiconductor with non-uniform trench oxide 100, in accordance with embodiments of the present invention.

Split gate semiconductor 100 may be formed on an n+ semiconductor substrate 140, e.g., a silicon substrate. A drain electrode 150 may be formed on the back side of substrate 140. An epitaxial layer 120 is formed on semiconductor substrate 140. Epitaxial layer 120 may be grown at a substantially constant doping level, e.g., constant to within manufacturing tolerances, in some embodiments. In some embodiments, epitaxial layer 120 may comprise varying doping levels, for example, doping levels that change according to discrete steps, and/or doping levels that change continuously, e.g., with depth.

Split gate semiconductor 100 comprises a plurality of parallel trenches 130, descending from a primary surface of a wafer into the epitaxial layer 120. Trenches 130 may be known as or referred to as "gate trenches," although it is to be appreciated that trenches 130 may comprise elements in addition to a "gate." In some embodiments, trenches 130 may descend into the substrate 140. Trenches 130 are generally evenly spaced from one another. Although only two such trenches are illustrated, embodiments in accordance with the present invention may have thousands of such trenches in parallel.

Trenches 130 comprise an upper electrode 111. Upper electrode 111 may comprise polysilicon, in some embodiments. Upper electrode 111 functions as a gate of a field effect transistor (FET), for example, to control the channel formation of the FET. Trenches 130 also comprise a lower electrode 101. Lower electrode 101 may comprise polysilicon, in some embodiments. Lower electrode 101 may be known as or referred to as a shield gate. In some embodiments, lower electrode 101 is electrically coupled to a constant DC voltage, for example, the source voltage. Lower electrode 101 may function to decrease the capacitance Cgd between drain electrode 150 and upper electrode 111, e.g., a gate electrode. Trenches 130 comprise a lower insulating material 108 beneath the lower electrode 101.

Trenches 130 comprise a first shield insulating material 103, located between the sides of shield electrode 101 and the edges of trench 130. Trenches 130 comprise a second shield insulating material 102, located between the sides of shield electrode 101 and the edges of trench 130, and above first shield insulating material 103. Trenches 130 comprise an inter-electrode insulating material 104, e.g., an inter-poly oxide, located between upper electrode 111 and lower electrode 101. Trenches 130 comprise a gate insulating material 105, sometimes known or referred to as a gate dielectric, located to the sides of upper electrode 111. First shield insulating material 103, second shield insulating material 102, inter-electrode insulating material 104, gate insulating material 105, and/or lower insulating material 108 may comprise, for example, silicon dioxide, high-K dielectric material, a low-K dielectric insulator, and/or an atomically deposited insulator, in some embodiments.

A "mesa" region exists between instances of trenches 130. The mesa region may comprise n+ source regions 116 situated on either side of the trenches 130. An insulating layer 106 may be formed over each source region 116 and each gate trench 130. Insulating layer 106 may comprise silicon dioxide, in some embodiments. A p– body region 114 may be formed below the source regions 116. The body region 114 may extend across the mesa region, for example, from trench to adjacent trench, in some embodiments. Body contact 115 may descend from source metal 107, in some embodiments.

Optional p-type regions 160 may be located beneath trenches 130, in some embodiments. P-type regions 160, when present, may be coupled to the source metal 107 to improve charge balance in device 100, in some embodiments. In other embodiments, the p-type regions 160 may float, e.g., regions 160 are not explicitly coupled to any other regions of device 100. P-type regions 160 are not required to extend in depth to the substrate, in some embodiments. The alternating p-type (p–) regions 160 and n-type (n–) regions 120 (or 123) form what is known as or referred to as a super junction. The p-type regions 160 may be formed by an implantation process after the trenches 130 are etched, for example using the trench etching mask, in some embodiments.

In accordance with embodiments of the present invention, the thickness x1 of first shield insulating material 103 at depth d1 is greater than the thickness x2 of second shield insulating material 102 at depth d2.

In the embodiment of FIG. 1, the epitaxial layer 120 has a non-uniform doping profile with respect to depth below a primary surface of the wafer. Epitaxial layer 120 comprises three sub layers or regions 121, 122, and 123, although that is not required. In some embodiments, each of the sub layers extend across the entire distance between the adjacent trench structures 130. In the embodiment of FIG. 1, the region 123 corresponds to (neighbors, or is adjacent to) the bottom portions of the trench structures 130, the region 122 corresponds to the distance d1, and the region 121 corresponds to the distance d2. The term "corresponds to," as used above and hereinafter, means that the region 123 overlaps the bottom of the trench structures 130, the region 122 overlaps portions of the insulating material 103 that have a thickness that is greater than the thickness x2, and that the region 121 overlaps portions of the insulating material 102 that has a thickness that is less than the thickness x1.

In the embodiment of FIG. 1, the dopant concentration (e.g., n–) in the region 123 is less than the dopant concentration (e.g., n) in the region 122, and the dopant concentration in the region 122 is less than the dopant concentration (e.g., n+) in the region 121. However, embodiments according to the present invention are not so limited. For example, the dopant concentration does not necessarily have to decrease with depth as just described. In general, the dopant concentration is higher where the oxide layer is thinner, and lower where the oxide layer is thicker. Thus, the relative dopant concentrations in different regions of the epitaxial layer 120 can be less than, equal to, or greater than one another depending on the corresponding thickness of the insulating materials 103 and 102. While three dopant concentration levels/regions are described in FIG. 1 and elsewhere, the present invention is not so limited; there can be more or less than three dopant concentration levels/regions.

In accordance with embodiments of the present invention, upper electrode 111 is not required to have a same width dimension as lower electrode 101. For example, a width of upper electrode 111 may not be the same width as a width of lower electrode 101 at depth d1 or at depth d2. Similarly, a thickness of insulating material 105, e.g., between upper electrode 111 and an edge of trench 130, need not be the same thickness as a thickness of insulating materials 102 or 103.

Figure 2:
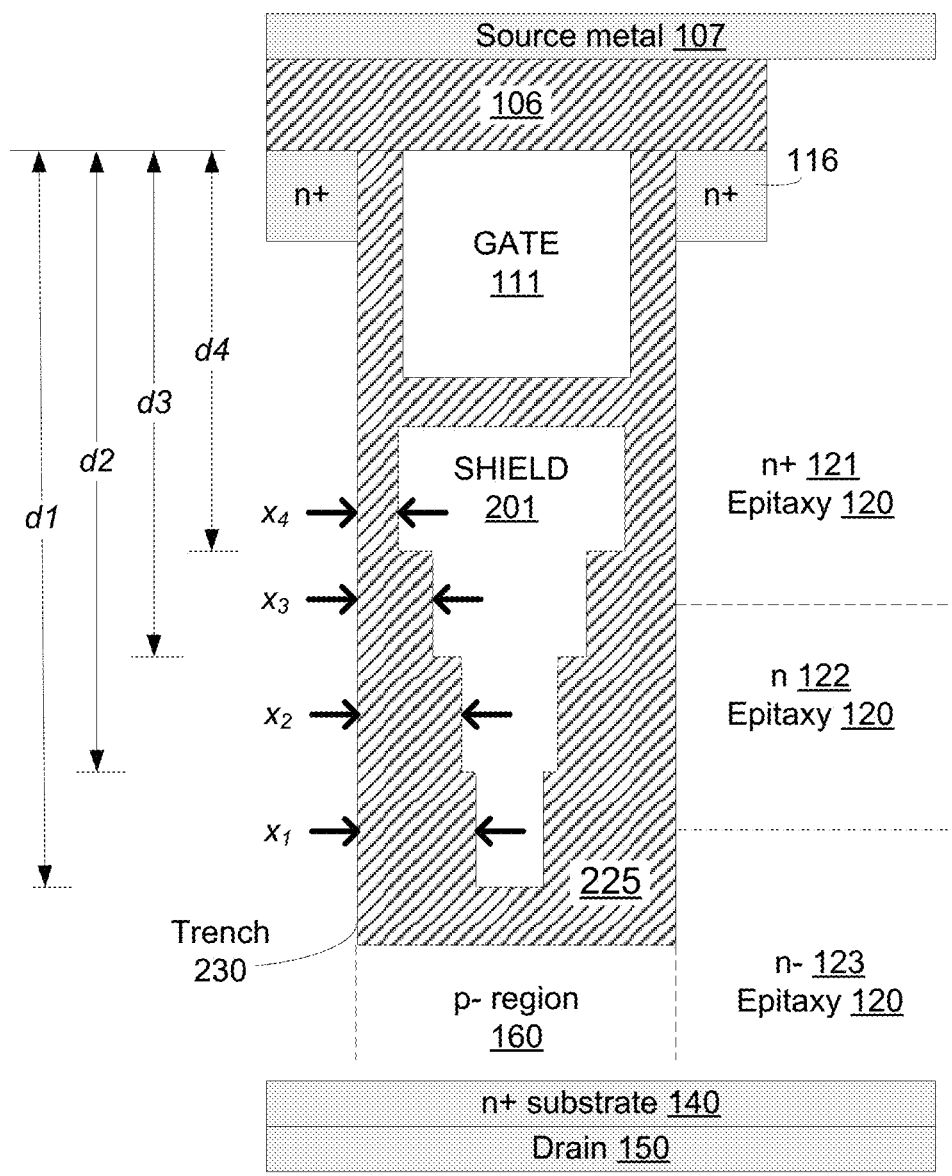
FIG. 2 illustrates an exemplary side sectional schematic view of a single trench portion of a split gate semiconductor with non-uniform trench oxide, in accordance with embodiments of the present invention.

FIG. 2 illustrates an exemplary side sectional schematic view of a single trench portion of a split gate semiconductor with non-uniform trench oxide 200, in accordance with embodiments of the present invention. As with semiconductor 100 (FIG. 1), a typical embodiment will have a plurality of similar trenches, and will also have additional features, for example, source and body regions between trenches, e.g., as illustrated in FIG. 1.

Trench 230 comprises an upper electrode 111, e.g., a gate electrode, and a shield electrode 211. Shield electrode 211 decreases in width (the horizontal dimension in the view of FIG. 2) in a step-wise fashion with depth from the primary surface of the wafer. In the embodiment of FIG. 2 there are four different widths of shield electrode 211, although that is not limiting. The depths of such steps need not be regular. For example, a difference between depth d1 and depth d2 may not be the same as a difference between depth d3 and depth d4, in some embodiments. The change in width of shield electrode 211 need not be regular. For example, the difference between width x1 and width x2 corresponds to a change in width of shield electrode 211, and may not be the same as a difference between width x3 and width x4, in some embodiments.

In accordance with embodiments of the present invention, the trench oxide 225 has a plurality of thicknesses along the sidewalls of the trench, for example, in regions between shield electrode 211 and epitaxy 120. In the embodiment of FIG. 2 there are four different thicknesses, x1, x2, x3, x4, of trench oxide 225 between shield electrode 211 and epitaxy 120, although that is not limiting.

As previously described with respect to FIG. 1, epitaxy 120 comprises a non-uniform doping profile with respect to depth below a primary surface of the wafer. Epitaxy 120 may comprise sub layers or regions 121, 122, and 123, although that is not required. In general, the dopant concentration is higher where the oxide layer is thinner, and lower where the oxide layer is thicker. It is to be appreciated that the number of sub-layers or regions of epitaxy 120 is not required to match the number of different thicknesses of trench oxide 225. For example, FIG. 2 illustrates four different thicknesses for trench oxide 225, e.g., x1, x2, x3, and x4, while illustrating three sub layers or regions 121, 122, and 123 of epitaxy 120.

Figure 3:
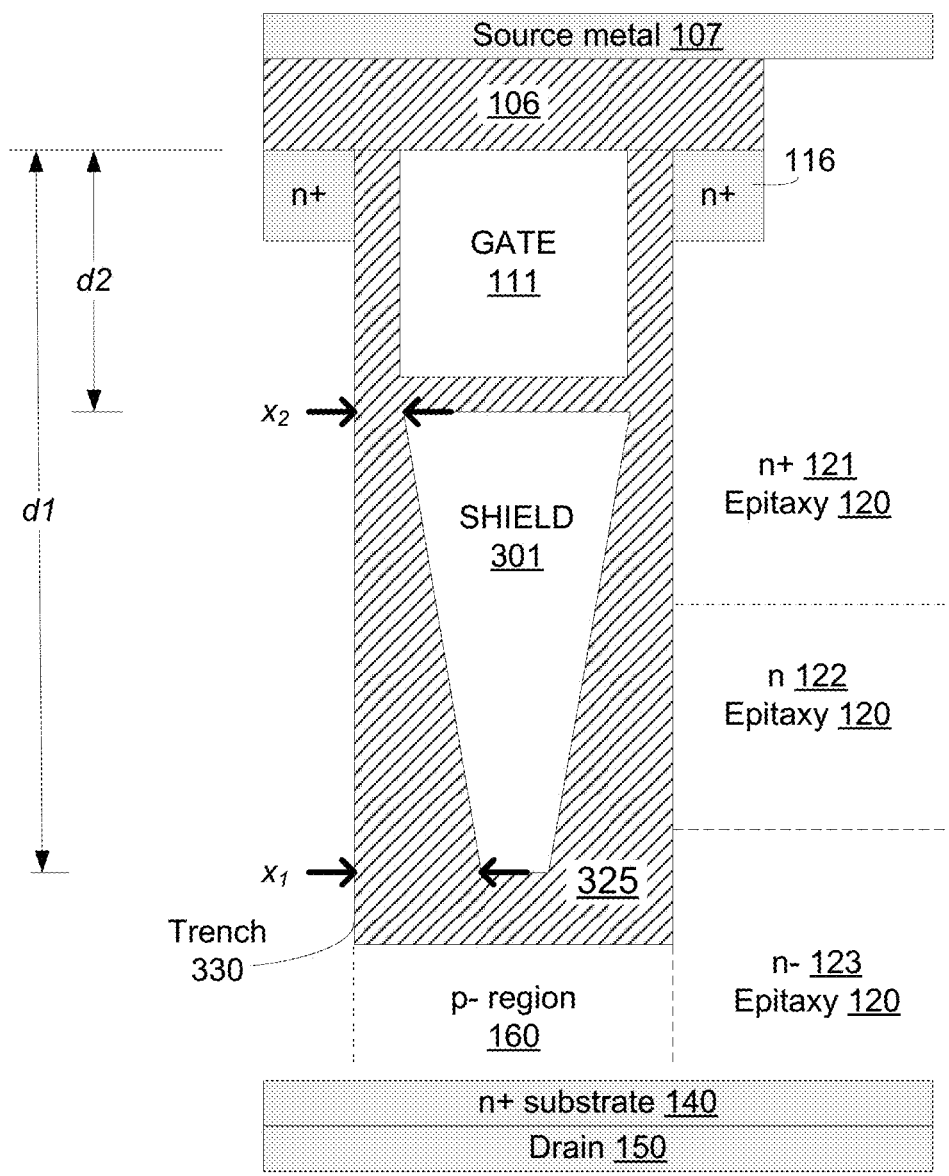
FIG. 3 illustrates an exemplary side sectional schematic view of a single trench portion of a split gate semiconductor with non-uniform trench oxide, in accordance with embodiments of the present invention.

FIG. 3 illustrates an exemplary side sectional schematic view of a single trench portion of a split gate semiconductor with non-uniform trench oxide 300, in accordance with embodiments of the present invention. As with semiconductor 100 (FIG. 1), a typical embodiment will have a plurality of similar trenches, and will also have additional features, for example, source and body regions between trenches, e.g., as illustrated in FIG. 1.

Trench 330 comprises an upper electrode 111, e.g., a gate electrode, and a shield electrode 301. Shield electrode 301 decreases in width (the horizontal dimension in the view of FIG. 3) in a substantially continuous fashion with depth, e.g., as measured from the primary surface of the wafer. For example, width x2 at depth d2 is greater than width x1 at depth d1.

Although the change in width of shield electrode 301 from width x1 to width x2 appears linear in the view of FIG. 3, such a linear change in width is not a requirement. Rather, a rate of change in width of shield electrode 301 may be non-linear. In some embodiments, such a rate of change in width of shield electrode 301 may be determined by semiconductor manufacturing processes, for example, a time value of etching, properties of non-isomeric etching, and/or oxidation with the shield electrode partially exposed to an oxidizing ambient.

In accordance with embodiments of the present invention, the trench oxide 325 increases in width (the horizontal dimension in the view of FIG. 3) in a substantially continuous fashion with depth, e.g., as measured from the primary surface of the wafer. For example, width x2 at depth d2 is less than width x1 at depth d1. In general, the width of trench oxide 325 should complement the width of shield electrode 301. For example, as shield electrode 301 becomes thinner, trench oxide 325 should become thicker. In some embodiments, a rate of change in width of trench oxide 325 may be non-linear and/or determined by semiconductor manufacturing processes, for example, a time value of etching and/or properties of non-isomeric etching.

As previously described with respect to FIG. 1, epitaxy 120 comprises a non-uniform doping profile with respect to depth below a primary surface of the wafer. Epitaxy 120 may comprise sub layers or regions 121, 122, and 123, although that is not required. In general, the dopant concentration is higher where the oxide layer is thinner, and lower where the oxide layer is thicker. It is to be appreciated that the number of sub-layers or regions of epitaxy 120 is not required to match the number of different thicknesses of trench oxide 225. For example, FIG. 3 illustrates three sub layers or regions 121, 122, and 123 of epitaxy 120 while illustrating a continuously changing width of shield electrode 301.

Figure 4:
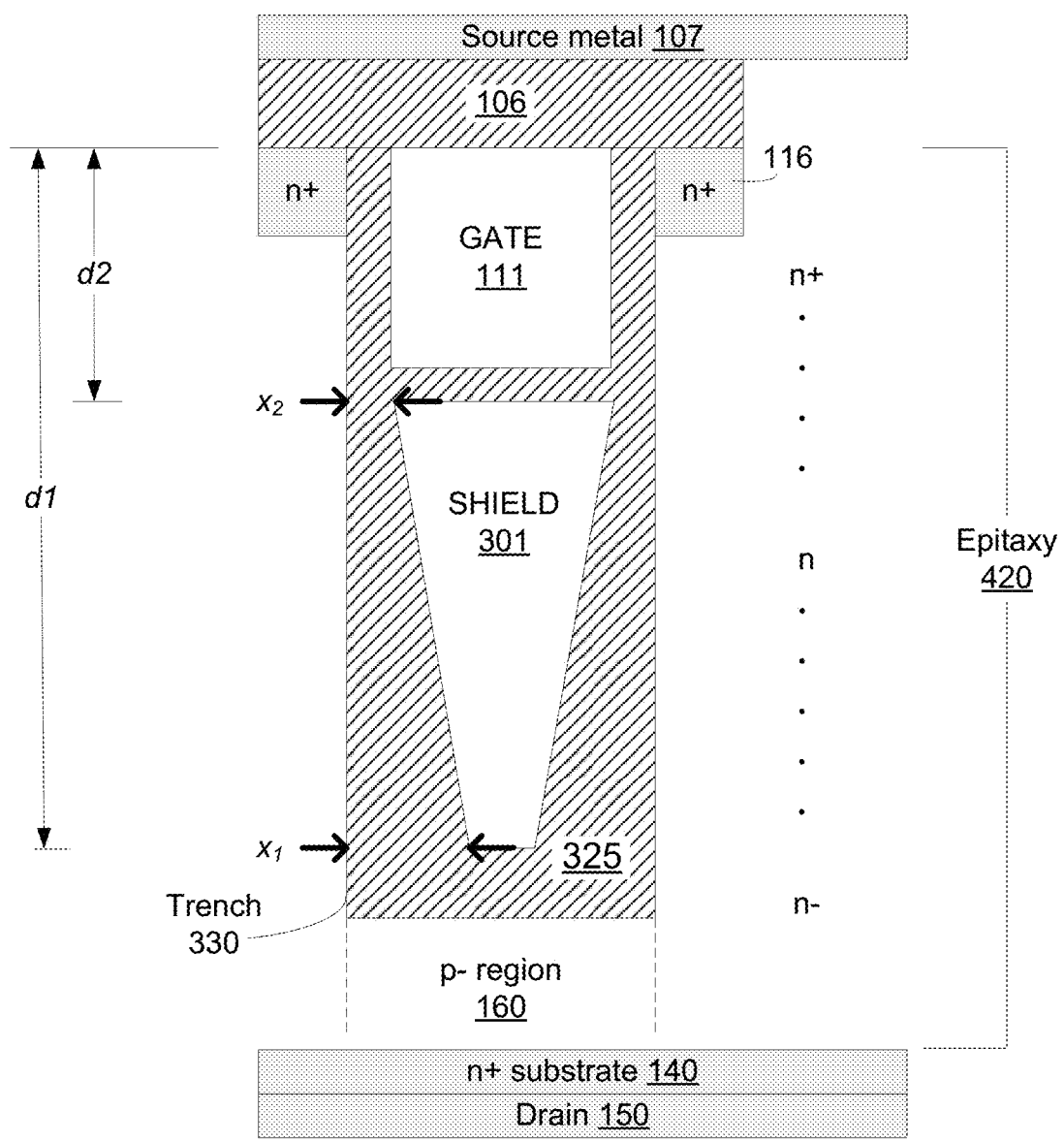
FIG. 4 illustrates an exemplary side sectional schematic view of a single trench portion of a split gate semiconductor with non-uniform trench oxide, in accordance with embodiments of the present invention.

FIG. 4 illustrates an exemplary side sectional schematic view of a single trench portion of a split gate semiconductor with non-uniform trench oxide 400, in accordance with embodiments of the present invention. As with semiconductor 100 (FIG. 1), a typical embodiment will have a plurality of similar trenches, and will also have additional features, for example, source and body regions between trenches, e.g., as illustrated in FIG. 1.

Trenches 330 are formed in epitaxy 420. Epitaxy 420 comprises a non-uniform doping profile with respect to depth below a primary surface of the wafer. In contrast to epitaxy 120 as illustrated in FIGS. 1, 2, and 3, epitaxy 420 comprises a substantially continuously changing doping profile. For example, a flow of a process gas is continuously changed during the epitaxial growth of epitaxy 420 in order to change dopant concentration during epitaxial growth. In general, the dopant concentration is higher where the oxide layer is thinner, and lower where the oxide layer is thicker. The dopant profile of epitaxy 420 need not be linear with respect to depth, in accordance with embodiments of the present invention.

Figure 5:
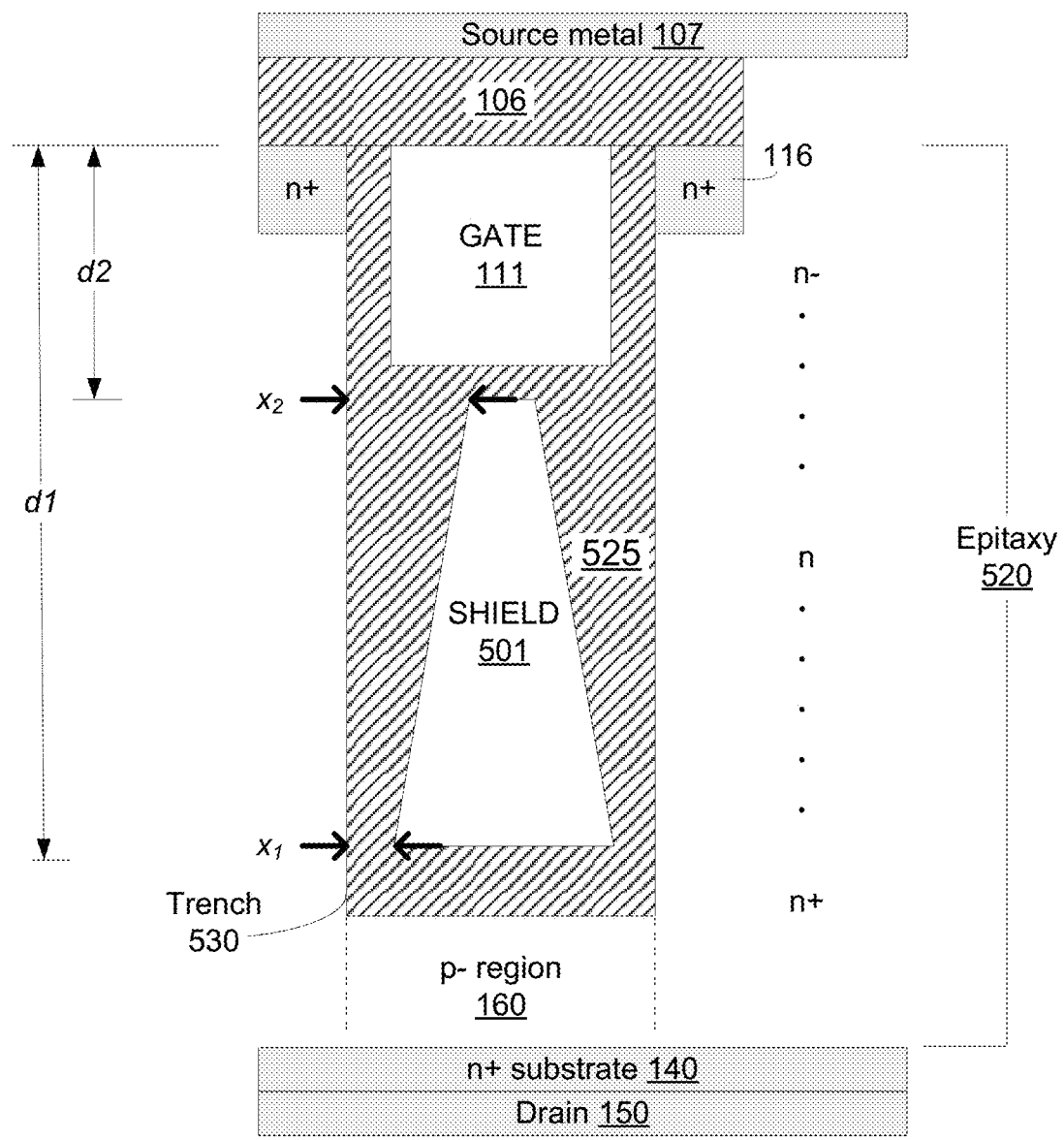
FIG. 5 illustrates an exemplary side sectional schematic view of a single trench portion of a split gate semiconductor with non-uniform trench oxide, in accordance with embodiments of the present invention.

FIG. 5 illustrates an exemplary side sectional schematic view of a single trench portion of a split gate semiconductor with non-uniform trench oxide 500, in accordance with embodiments of the present invention. As with semiconductor 100 (FIG. 1), a typical embodiment will have a plurality of similar trenches, and will also have additional features, for example, source and body regions between trenches, e.g., as illustrated in FIG. 1.

Trench 530 comprises an upper electrode 111, e.g., a gate electrode, and a shield electrode 511. Shield electrode 511 increases in width (the horizontal dimension in the view of FIG. 5) in a substantially continuous fashion with depth from the primary surface of the wafer. For example, width x2 at depth d2 is less than width x1 at depth d1.

Trenches 530 are formed in epitaxy 520. Epitaxy 520 comprises a non-uniform doping profile with respect to depth below a primary surface of the wafer. In contrast to epitaxy 120 as illustrated in FIGS. 1, 2, and 3, epitaxy 520 comprises a substantially continuously changing doping profile. For example, a flow of a process gas is continuously changed during the epitaxial growth of epitaxy 520 in order to change dopant concentration during epitaxial growth. In general, the dopant concentration is higher where the oxide layer is thinner, and lower where the oxide layer is thicker. In contrast to epitaxy 420 as illustrated in FIG. 4, epitaxy 520 increases conductance, e.g., increases dopant concentration, with increasing depth from a primary surface of a wafer, to correspond to a depth profile of trench oxide 525.

Figure 6:
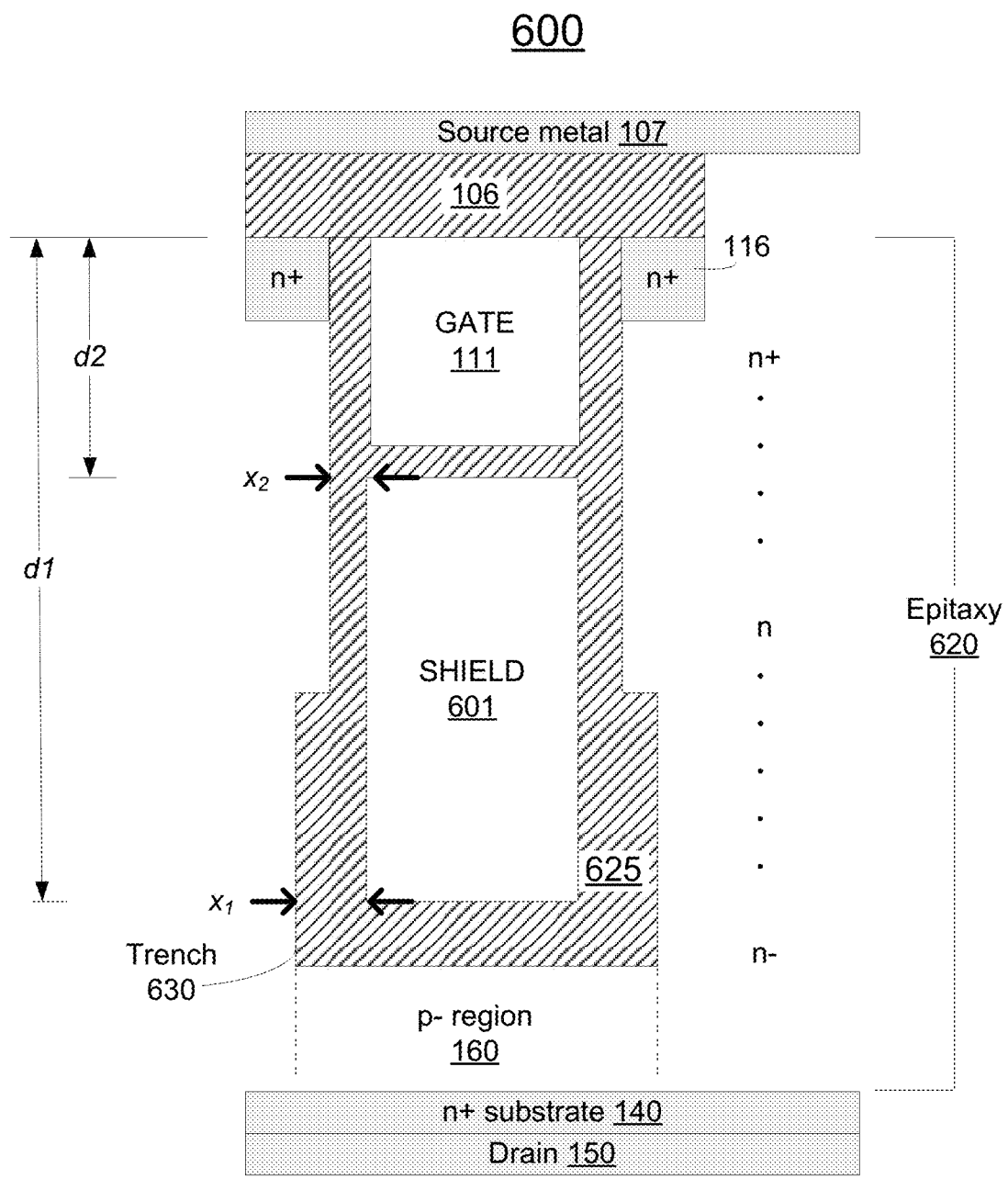
FIG. 6 illustrates an exemplary side sectional schematic view of a single trench portion of a split gate semiconductor with non-uniform trench oxide, in accordance with embodiments of the present invention.

FIG. 6 illustrates an exemplary side sectional schematic view of a single trench portion of a split gate semiconductor with non-uniform trench oxide 600, in accordance with embodiments of the present invention. As with semiconductor 100 (FIG. 1), a typical embodiment will have a plurality of similar trenches, and will also have additional features, for example, source and body regions between trenches, e.g., as illustrated in FIG. 1.

Trenches 630 are formed in epitaxy 620. The width of trenches 630 is not constant with respect to depth below the primary surface of a semiconductor wafer. For example, trenches 630 increase in width with depth below the primary surface. For example, trenches 630 are wider at depth d1 than at depth d2.

Trenches 630 comprise a lower electrode 601. Lower electrode 601 is characterized as having a substantially constant width throughout its extent. For example, a width of lower electrode 601 at depth d1 is substantially the same as a width of lower electrode 601 at depth d2.

Epitaxy 620 comprises a non-uniform doping profile with respect to depth below a primary surface of the wafer. Epitaxy 620 comprises a substantially continuously changing doping profile. For example, a flow of a process gas is continuously changed during the epitaxial growth of epitaxy 620 in order to change dopant concentration during epitaxial growth. In general, the dopant concentration is higher where the oxide layer 625 is thinner, e.g., at depth d2, and the dopant concentration is lower where the oxide layer 625 is thicker, e.g., at depth d1. The dopant profile of epitaxy 620 need not be linear with respect to depth, in accordance with embodiments of the present invention.

Various combinations of trenches, shield gate profiles, trench oxide profiles, and epitaxial doping profiles are well suited to, and are considered within the scope of embodiments of the present invention. As but one non-limiting example, trenches 130 (FIG. 1), trenches 230 (FIG. 2), and/or trenches 330 (FIG. 3) are well suited to epitaxial layers 120 (FIG. 1) with a constant doping, with a stepped doping profile, e.g., epitaxy 121, 122, 123 (FIG. 1), or with a continuously varying doping profile, e.g., epitaxy 420 (FIG. 4).

Figure 7:
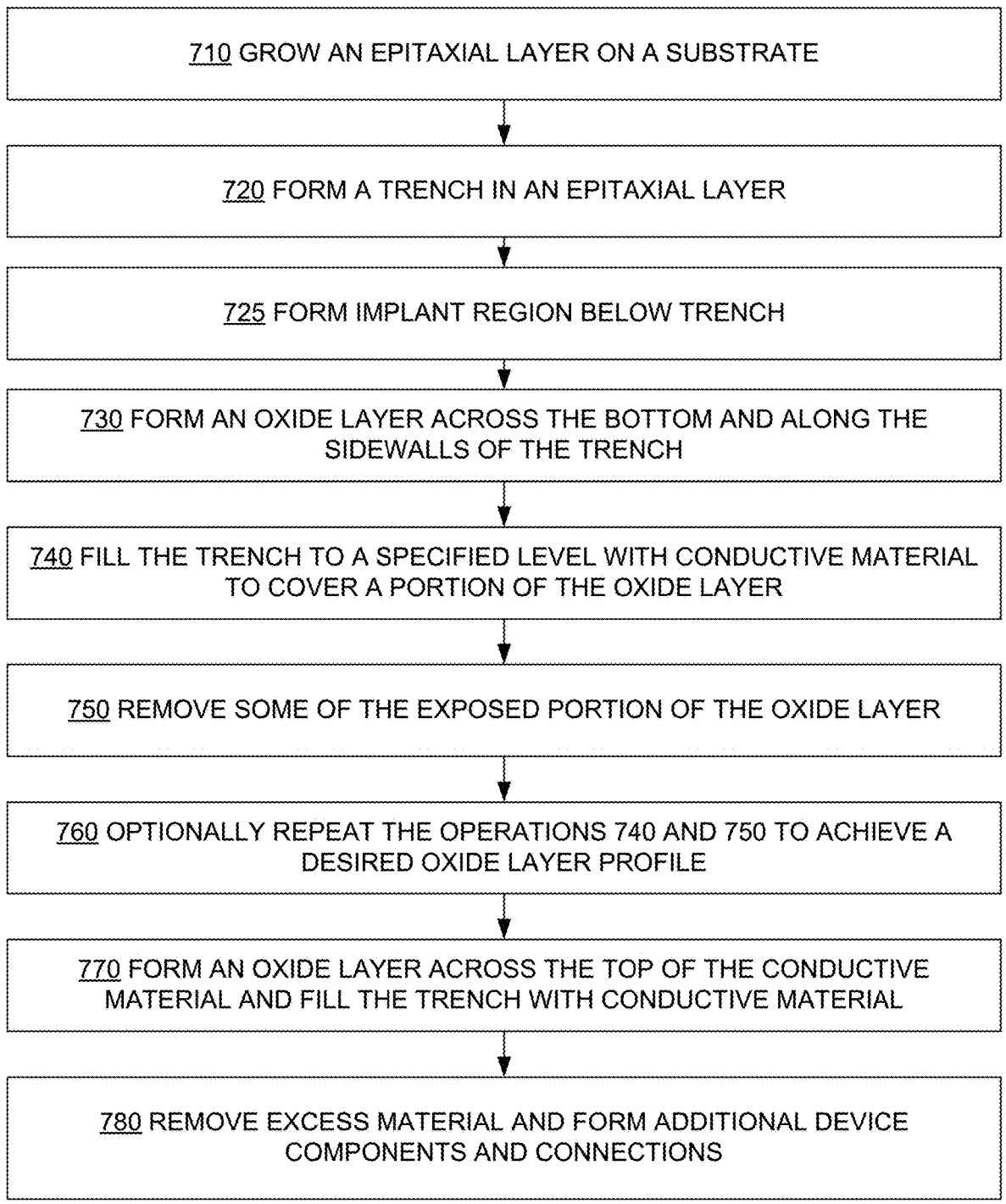
FIG. 7 is a flowchart of an exemplary method for fabricating a split gate semiconductor with non-uniform trench oxide, in accordance with embodiments of the present invention.

FIG. 7 is a flowchart 700 of an exemplary method for fabricating a split gate semiconductor with non-uniform trench oxide, in accordance with embodiments of the present invention. Operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps. Also, FIG. 7 is discussed in the context of a single trench and trench structure; however, multiple trenches and trench structures can be fabricated in parallel.

FIGS. 8, 9, 10, 11, 12, and 13 illustrate portions of an exemplary semiconductor device at various stages of a fabrication process, in accordance with embodiments of the present invention.

In 710, an epitaxial layer, e.g., epitaxy 120 (FIG. 1), is grown on a substrate, e.g., substrate 140 (FIG. 1). The epitaxial layer may comprise multiple sub layers, and may be grown in multiple operations, in accordance with embodiments of the present invention. Dopant may be added to the epitaxial layer in one or more process steps, for example, during epitaxial growth or post growth, to increase the concentration of dopant in some regions of the epitaxial layer relative to other regions of the epitaxial layer, as described above. For example, in an embodiment, additional dopant can be driven into the regions of the epitaxial layer 120 corresponding to the regions 121 and 122 (FIG. 1), to increase their dopant concentration relative to the region 123. Then, additional dopant can again be driven into the region 121, to increase its dopant concentration relative to the region 122.

However, embodiments according to the invention are not limited to the example of FIG. 1. In general, as previously described herein, dopant is added to an epitaxial layer to produce a non-uniform concentration of dopant in the epitaxial layer, where the concentration varies according to the thickness of the oxide layer separating a shield electrode from an epitaxial layer, e.g., insulating materials 102 and 103 of FIG. 1. More specifically, the dopant concentration may be higher in a region of an epitaxial layer adjacent to a thinner portion of the insulating layer, and the dopant concentration may be lower in a region of the epitaxial layer adjacent to a thicker portion of the insulating layer.

Also, the various dopant concentrations in an epitaxial layer can be introduced at any point before, after, or while the other operations included in the flowchart 700 are performed. For example, the epitaxial layer 820 may be doped before the trench 830 (FIG. 8) is etched. For example, the trench can be etched in an epitaxial layer that has already been doped.

Figure 8:
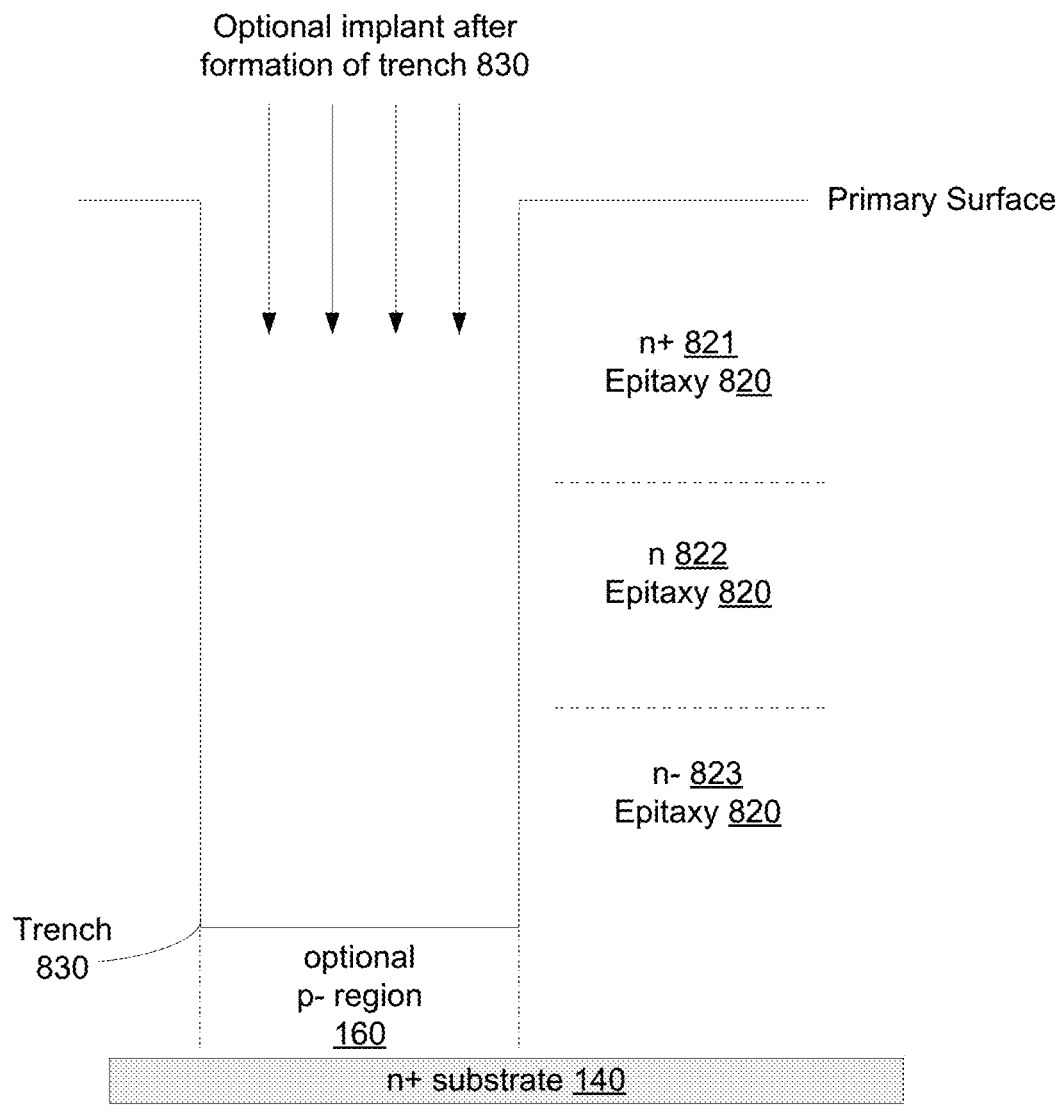
FIGS. 8, 9, 10, 11, 12, and 13 illustrate portions of an exemplary semiconductor device at various stages of a fabrication process, in accordance with embodiments of the present invention.

In 720 of FIG. 7, and with reference to FIG. 8, a trench 830 is etched in an epitaxial layer 820 that was formed over a substrate 140. Insulating material (not shown) may also be formed over the upper surface of the epitaxial layer 820. The trench 830 may be entirely within epitaxial layer 820, extend to the interface between epitaxial layer 820 and substrate 140, or extend into substrate 140. In an embodiment, the trench 830 may be etched through an oxide hard mask or some other masking material like silicon nitride or photoresist. In optional 725 of FIG. 7, and still with reference to FIG. 8, a region below trench 830, e.g., p-type region 160, may be implanted. In general, such an implant will have an opposite conductivity type to the conductivity type of the epitaxial layer 820. The implant may be performed through the trench 830 utilizing the same etching mask utilized for the formation of trench 830, in some embodiments.

Figure 9:
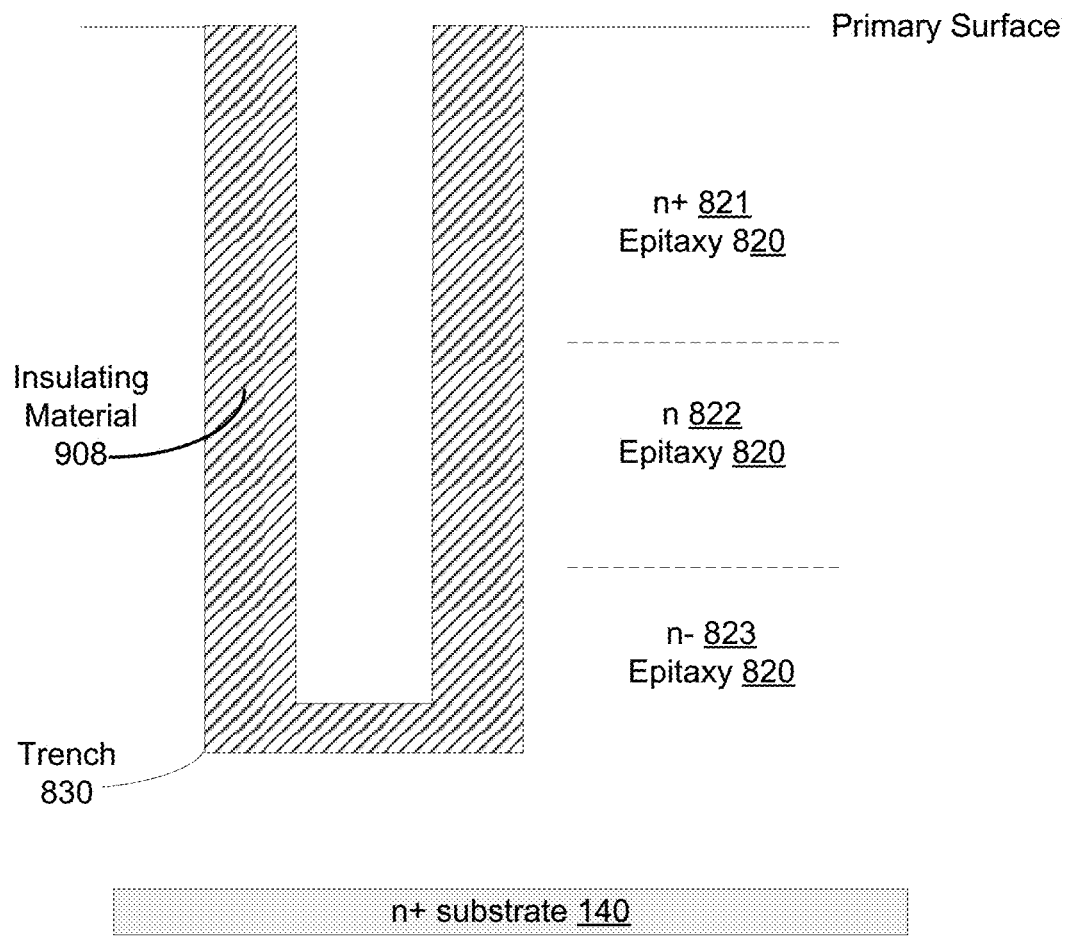

In 730 of FIG. 7, with reference to FIG. 9, an insulating material 908, e.g., oxide, is formed, for example, deposited or grown, across the bottom and along the sidewalls of the trench 830. The thickness of the insulating material 908 is determined by the required breakdown voltage ratings. For example, the thickness of the insulating material 908 is about 0.7 micrometers (μm) for a device rated at 200 V, and about 0.5 micrometers (μm) for a device rated at 100 V. In an embodiment, the insulating material 908 has a uniform thickness along the sidewalls of the trench 830 as shown in the example of FIG. 9. In another embodiment, the insulating material 908 has a non-uniform thickness. For example, the thickness of the oxide layer may be thicker toward the bottom of the trench 830 and become thinner as the distance from the bottom of the trench increases. In an embodiment, the thickness of the insulating material 908 decreases linearly as the distance from the bottom of the trench 830 increases.

Figure 10:
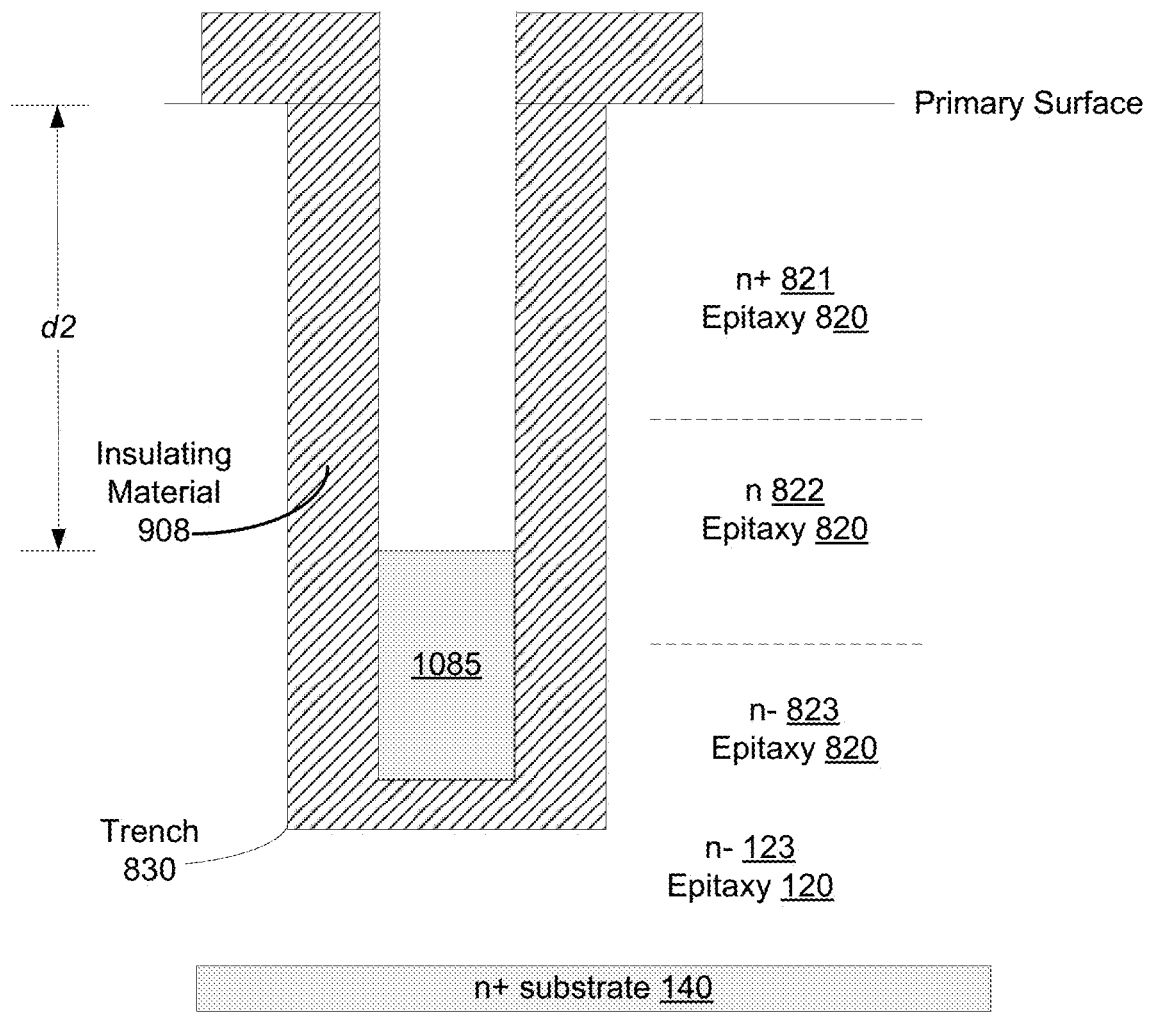

In 740 of FIG. 7, with reference to FIG. 10, the trench 830 is filled to a specified depth, e.g., depth d2, with a conductive material 1085, such as doped polysilicon. In an embodiment, the material 1085 is deposited past the specified depth, and then etched back to the specified depth. Instead of depositing doped polysilicon, undoped polysilicon may be deposited and then doped by well-known methods, for example, using POCl₃ (phosphoryl chloride, also known as phosphorus oxychloride) or phosphorus implantation and drive-in.

Figure 11:
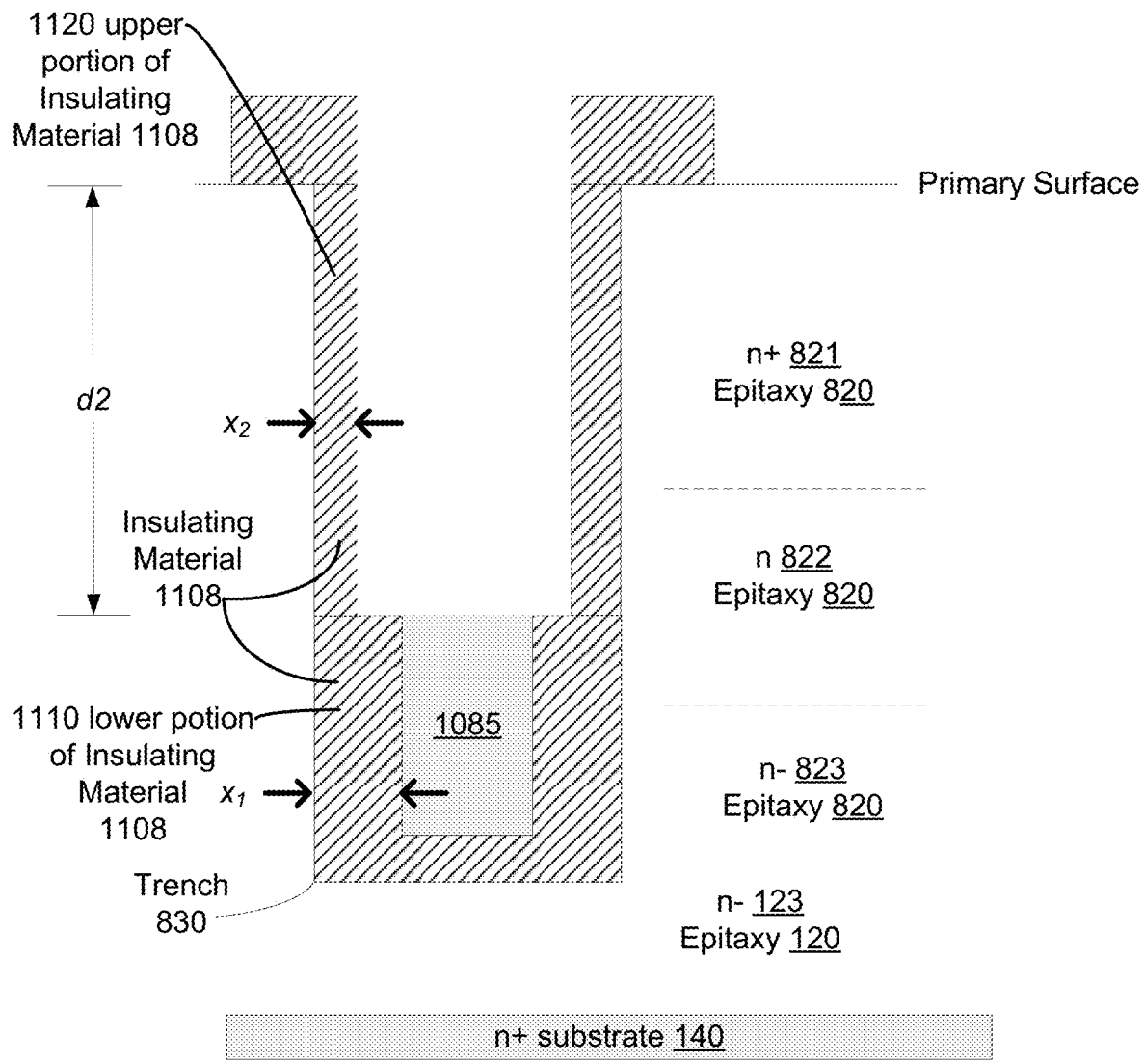

In 750 of FIG. 7, with reference to FIG. 11, the insulating material 908 is etched back to a specified depth, e.g., the depth d2, forming insulating material 1108. The material 1085 may mask the lower portion 1110 of the insulating material 908, so that the lower portion of the insulating material 908 is not etched back. In an embodiment, only some of the insulating material 1108 is removed in the upper portion 1120. As a result, the thickness x2 of the upper portion 1120 of the insulating material 1108 is less than the thickness x1 of the lower portion 1110 of the insulating material 1108.

Figure 12:
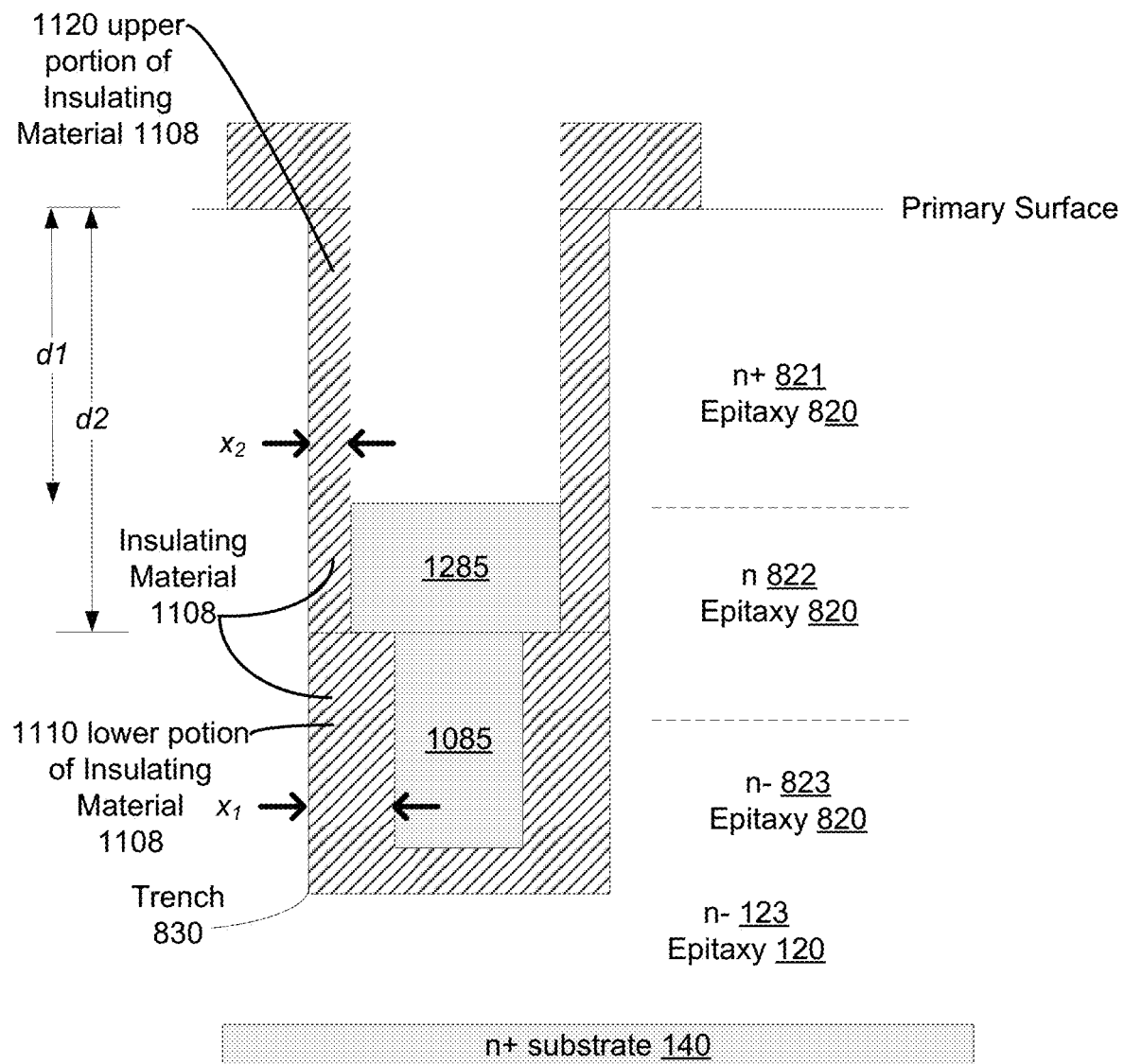

In 760 of FIG. 7, with reference to FIG. 12, the operations of blocks 740 and/or 750 are repeated to achieve a desired profile for the insulating material 1108.

More specifically, some of the remaining volume of the trench 830 is filled with the same type of material 1085 that was deposited in 730 above. For example, a remaining portion of the trench 830 may be filled to a specified depth, e.g., depth d1, with a material 1285, such as doped polysilicon. It is appreciated that material 1285 is physically and electrically contiguous with material 1085, in some embodiments. The exposed portion of the insulating material 1120 may be etched back again to further thin that portion of the insulating layer, similar to the operation of 740.

In general, the operations of blocks 740 and 750 may be repeated as many times as necessary to achieve a desired profile (cross-section) for the insulating material 1108. For example, the operations 730 and 740 may be performed four times to achieve the profile in the exemplary embodiment of FIG. 2.

Figure 13:
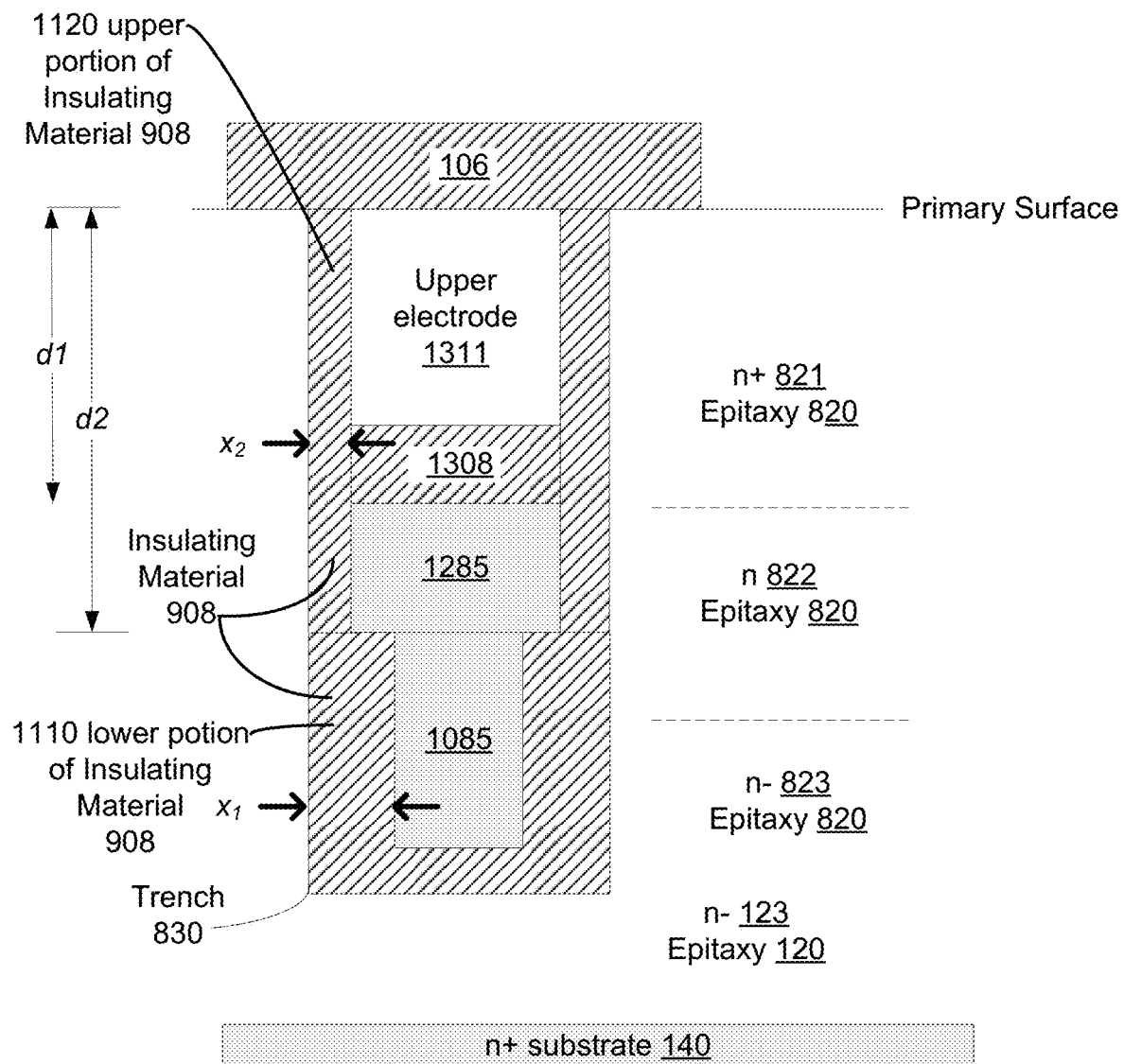

In 770, with reference to FIG. 13, an insulating material 1308, e.g., oxide, is deposited or grown across the top of material 1285. Insulating material 1308 may be the same as, or similar in composition to insulating material 908 (FIG. 9). After formation of insulating material 1308, a conductive material 1311 is deposited to form an upper electrode, e.g., upper electrode 111 (FIG. 1). Material 1311 may comprise polysilicon, in some embodiments.

Once the trench 830 is completely filled, excess material may be removed using, for example, CMP (chemical mechanical planarization or polishing), so that the top surface of material in the trench structure 830, comprising multiple electrodes and insulating material(s), is flush with adjacent surfaces.

In optional 780, a device or structure(s) are formed in the region(s) adjacent to the trench 830. Such structure(s) may include, for example, source regions, e.g., source regions 116 (FIG. 1), body regions, e.g., body region 114 (FIG. 1), a body contact, e.g., body contact 115 (FIG. 1), and the like. Connections and/or electrical couplings to such regions may also be formed. For example, upper electrode 1311 may be coupled to a gate terminal, and conductive materials 1285 and 1085 may be coupled to a source terminal.

Embodiments in accordance with the present invention provide systems and methods for split gate semiconductors with non-uniform trench oxide. In addition, embodiments in accordance with the present invention provide systems and methods for split gate semiconductors with non-uniform trench oxide that have a non-uniform epitaxial layer. Further, embodiments in accordance with the present invention provide systems and methods for split gate semiconductors with non-uniform trench oxide in which a doping level of an epitaxial layer corresponds to a thickness of a trench oxide. Still further, embodiments in accordance with the present invention provide systems and methods for split gate semiconductors with non-uniform trench oxide that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A metal oxide semiconductor field effect transistor (MOSFET) comprising:
   a primary surface;
   a plurality of parallel trenches, wherein each comprise:
      a first electrode coupled to a gate terminal of said MOSFET;
      a second electrode, physically and electrically isolated from said first electrode,
   wherein said second electrode is beneath said first electrode in said trench,
   wherein said second electrode comprises a step change in width,
   wherein said second electrode is wider at a depth closer to said primary surface in comparison to a depth farther away from said primary surface,
   wherein said plurality of parallel trenches are formed in an epitaxial layer, and
   wherein said epitaxial layer is uniform in a horizontal dimension parallel to said primary surface in a region between said plurality of parallel trenches; and
   a region below at least one of said plurality of parallel trenches having a reduced conductivity of a conductivity type of said epitaxial layer in comparison to a conductivity of a region of said epitaxial layer at a depth below said primary surface of a lowest portion of said second electrode.

2. The MOSFET of claim 1 further comprising an insulating material filling an extent between edges of said second electrode and edges of said trench.

3. The MOSFET of claim 2 wherein said insulating material comprises an atomically deposited insulator.

4. The MOSFET of claim 1 further comprising a region below at least one of said plurality of parallel trenches having an opposite conductivity type to a conductivity type of said epitaxial layer.

5. The MOSFET of claim 1 wherein said epitaxial layer comprises:
   a relatively higher doping level adjacent to a relatively thinner layer of said insulating material; and
   a relatively lower doping level adjacent to a relatively thicker layer of said insulating material.

6. The MOSFET of claim 5 wherein a thickness of said insulating material increases with depth below said primary surface of said MOSFET.

7. The MOSFET of claim 6 wherein said thickness of said insulating material increases substantially linearly with depth below said primary surface of said MOSFET.

8. The MOSFET of claim 1 further comprising:
   a source terminal, and
   wherein said second electrode is electrically coupled to said source terminal.

9. A semiconductor device, comprising:
   a substrate layer;
   an epitaxial layer adjacent to the substrate layer;
   a first trench structure formed in the epitaxial layer and having a bottom and sidewalls, wherein the first trench structure comprises:
   a gate electrode;
   a source electrode electrically isolated from said gate electrode; and
   an oxide layer that lines the sidewalls adjacent to said source electrode, the oxide layer having a non-uniform thickness along the sidewalls, wherein the thickness of the oxide layer at a first distance from the bottom is less than the thickness of the oxide layer at the bottom, and wherein the thickness of the oxide layer at a second distance from the bottom, greater than the first distance, is less than the thickness of the oxide layer at the first distance,
   wherein the epitaxial layer is characterized as uniform in a horizontal dimension at all depths between said first distance and said second distance,
   wherein the epitaxial layer has a non-uniform dopant concentration, and
   wherein the non-uniform dopant concentration varies according to the thickness of the oxide layer adjacent thereto.

10. The semiconductor device of claim 9, wherein a region of the epitaxial layer at a depth corresponding to the first distance has a first dopant concentration, and a region of the epitaxial layer at a depth corresponding to the second distance has a second dopant concentration.

11. The semiconductor device of claim 10, wherein the first dopant concentration is less than the second dopant concentration.

12. The semiconductor device of claim 9, wherein the thickness of the oxide layer deceases linearly along a length of the sidewalls between the first distance and the second distance.

13. The semiconductor device of claim 9, wherein the oxide layer has a uniform first thickness from above the bottom of the first trench structure to the first distance, and has a uniform second thickness from the first distance to the second distance, the second thickness less than the first thickness.

14. The semiconductor device of claim 9, further comprising a structure formed adjacent to the first trench structure, the structure comprising: a second trench filled with material, a body region, and a source region.

15. A semiconductor device, comprising:
a substrate layer;
an epitaxial layer adjacent to the substrate layer;
a first trench structure formed in the epitaxial layer, the first trench structure having a bottom, a first sidewall, and a second sidewall, wherein the first trench structure further comprises a first conductive material coupled to a source terminal,
wherein the first trench structure further comprises a second conductive material electrically isolated from said first conductive material; and
an oxide layer that lines the bottom and the first and second sidewalls, the oxide layer comprising a first portion that spans the bottom of the first trench structure from the first sidewall to the second sidewall, a second portion extending from the first portion along the first sidewall, and a third portion extending from the second portion along the first sidewall, wherein the oxide layer has a first thickness in the second portion and a second thickness in the third portion, the second thickness less than the first thickness,
wherein the epitaxial layer is characterized as uniform in a horizontal dimension at all depths adjacent to the first sidewall,
wherein the first thickness decreases linearly as distance from the bottom increases, and wherein the second thickness decreases linearly as distance from the bottom increases.

16. The semiconductor device of claim 15, wherein the epitaxial layer comprises a first region neighboring the first portion of the oxide layer, a second region neighboring the second portion of the oxide layer, and a third region neighboring the third portion of the oxide layer, wherein the first region has a first dopant concentration, the second region has a second dopant concentration, and the third region has a third dopant concentration.

17. The semiconductor device of claim 16, wherein the third dopant concentration is greater than the second dopant concentration, and the second dopant concentration is greater than the first dopant concentration.

18. The semiconductor device of claim 15, wherein the first thickness is uniform in the second portion of the oxide layer, and wherein the second thickness is uniform in the third portion of the oxide layer, the second thickness less than the first thickness.

19. The semiconductor device of claim 15, further comprising a structure formed adjacent to the first trench structure, the structure comprising: a second trench filled with material, a body region, and a source region between said first trench structure and said second trench.

* * * * *